United States Patent
Lee et al.

(10) Patent No.: US 8,939,696 B2
(45) Date of Patent: Jan. 27, 2015

(54) AUTOMATIC CARRIER TRANSFER FOR TRANSFERRING A SUBSTRATE CARRIER IN A SEMICONDUCTOR MANUFACTURING POST-PROCESS AND METHOD OF TRANSFERRING THE SUBSTRATE CARRIER USING THE SAME

(71) Applicant: Samsung Electronics Co., Ltd., Suwon-Si, Gyeonggi-Do (KR)

(72) Inventors: Jae-Nam Lee, Asan-si (KR); In-Cheol Kim, Suwon-si (KR); Jong-Hoon Kim, Cheonan-si (KR); Hee-Sang Yang, Cheonan-si (KR); Yu-Dong Won, Suwon-si (KR); Sung-Yeol Lee, Cheonan-si (KR); Jong-In Lee, Suwon-si (KR); Min-Gu Chang, Anyang-si (KR); Woo-Chul Jeon, Gwangju (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 148 days.

(21) Appl. No.: 13/670,197

(22) Filed: Nov. 6, 2012

(65) Prior Publication Data

US 2013/0216336 A1 Aug. 22, 2013

(30) Foreign Application Priority Data

Feb. 22, 2012 (KR) .................. 10-2012-0017771

(51) Int. Cl.
*H01L 21/677* (2006.01)

(52) U.S. Cl.
USPC .................. 414/222.01; 414/225.01

(58) Field of Classification Search
CPC ............. H01L 21/67763; H01L 21/67766; H01L 21/6779
USPC .......... 414/940, 225.01, 222.01, 805
See application file for complete search history.

(56) References Cited

U.S. PATENT DOCUMENTS

| | | | |
|---|---|---|---|
| 6,129,496 A | 10/2000 | Iwasaki et al. | |
| 6,280,134 B1 | 8/2001 | Nering | |
| 6,449,530 B1 | 9/2002 | Yamada et al. | |
| 6,926,489 B2 * | 8/2005 | Lee et al. | 414/217 |
| 7,044,703 B2 | 5/2006 | Fukuda et al. | |
| 8,348,584 B2 * | 1/2013 | Mizokawa et al. | 414/225.01 |
| 2003/0051973 A1 | 3/2003 | Davis | |
| 2003/0077159 A1 * | 4/2003 | Iizuka | 414/609 |
| 2004/0052624 A1 | 3/2004 | Miyano et al. | |

(Continued)

FOREIGN PATENT DOCUMENTS

| | | |
|---|---|---|
| JP | 08167641 A | 6/1996 |
| JP | 11-059829 | 3/1999 |

(Continued)

*Primary Examiner* — Kaitlin Joerger
(74) *Attorney, Agent, or Firm* — Harness, Dickey & Pierce, P.L.C.

(57) ABSTRACT

A carrier transfer for automatically transferring a substrate carrier includes a gripper detachably coupled to the substrate carrier, the substrate carrier including a plurality of substrates and at least one open gate through which the plurality of substrates are loaded into or unloaded from the substrate carrier. The gripper includes a gate blocking unit secured to the gripper and configured to shift to a blocking position, the blocking position being a position of the gate blocking unit that partially blocks the gate to prevent the plurality of substrates from being separated from the substrate carrier during the automatic transferring of the substrate carrier.

18 Claims, 7 Drawing Sheets

(56) References Cited

U.S. PATENT DOCUMENTS

| | | | |
|---|---|---|---|
| 2004/0191042 A1* | 9/2004 | Chen et al. | 414/618 |
| 2005/0246055 A1* | 11/2005 | Reyes et al. | 700/213 |
| 2008/0260504 A1 | 10/2008 | Gifford et al. | |
| 2009/0297299 A1 | 12/2009 | Campbell et al. | |
| 2010/0143084 A1* | 6/2010 | Murata et al. | 414/225.01 |
| 2011/0024377 A1* | 2/2011 | Yamamoto | 212/71 |
| 2013/0220959 A1* | 8/2013 | Won et al. | 212/276 |

FOREIGN PATENT DOCUMENTS

| | | |
|---|---|---|
| JP | 2003-237941 A | 8/2003 |
| JP | 2009177032 A | 8/2009 |
| KR | 20050045153 A | 5/2005 |
| KR | 20060018454 A | 3/2006 |
| KR | 20090067236 A | 6/2009 |
| KR | 100959505 B1 | 5/2010 |
| KR | 2010-0071550 A | 6/2010 |
| KR | 2011-0023026 A | 3/2011 |

* cited by examiner

AUTOMATIC CARRIER TRANSFER FOR TRANSFERRING A SUBSTRATE CARRIER IN A SEMICONDUCTOR MANUFACTURING POST-PROCESS AND METHOD OF TRANSFERRING THE SUBSTRATE CARRIER USING THE SAME

CROSS-REFERENCE TO RELATED APPLICATIONS

This application claims the benefit of Korean Patent Application No. 10-2012-0017771 filed on Feb. 22, 2012 in the Korean Intellectual Property Office, the disclosure of which is incorporated herein in its entirety by reference.

BACKGROUND

1. Field

At least one example embodiment relates to an automatic carrier transfer and/or a method of automatically transferring a substrate carrier using the same, and more particularly, to an automatic carrier transfer for transferring a substrate carrier in a semiconductor manufacturing post-process and/or a method of transferring the substrate carrier using the same in the semiconductor manufacturing post-process.

2. Description of the Related Art

In general, the semiconductor industry requires high integration technology for forming more integrated circuit devices on a limited unit area and mass productivity for manufacturing a much greater number of the semiconductor devices at a time with high processing speed.

Thus, various high speed and accurate processing apparatuses may be provided in a manufacturing line for the semiconductor devices. The processing apparatuses may be arranged according to stream efficiency and the relations between the unit processes in the manufacturing line.

A wafer carrier is usually used for carrying wafers between processing apparatuses of consecutive unit processes. When a specific unit process is completed on the wafers, the completed wafers are loaded in the wafer carrier and then transferred by the wafer carrier with high speed and sufficient cleanliness to the neighboring processing apparatus for the next process.

In general, the semiconductor device is fabricated through a pre-process in which microelectronic circuits are patterned on a semiconductor substrate, such as a wafer, and a post-process in which the microelectronic circuits are cut into memory chips and each memory chip is packaged together with wirings.

The pre-process may include various pre-unit processes for forming the memory cells on the wafer, such as an oxidation process, a coating process, a developing process, an etching process, an ion implanting process, a deposition process, a metal wiring process, etc. The post-process may include various post-unit processes for packaging the memory chips or dies, such as an electronic die sort (EDS) test, a sawing process, a die attach process, a wire bonding process, a molding process, a final test, etc.

In the pre-process, the wafer sequentially moves through the processing apparatuses of the pre-unit processes step by step and the integrated circuit devices are formed on the wafer. Thereafter, the wafer experiences the post-process in which the wafer including the integrated circuit devices is cut into a plurality of memory chips, and a printed circuit board having at least one memory chip sequentially moves through the processing apparatuses of the post-unit processes step by step, to thereby manufacture the semiconductor device.

Particularly, since the pre-processes require a high degree of cleanliness, the processed wafer in the pre-process is usually loaded in the substrate carrier having a sealing front door, which is generally called as a FOUP (front opening unified pod), and then a carrier transfer transfers the substrate carrier to the next unit process apparatus for performing the next process. Since the inside of the FOUP is sufficiently sealed from surroundings by the sealing front door, the processed wafer is prevented from being contaminated in carrying the wafer between unit steps. In addition, since the processed wafer is enclosed by the front door, the wafer is prevented from being unloaded from the FOUP in carrying the wafer.

Each pre-unit process apparatus usually includes a FOUP port on which the FOUP is accurately located at a predetermined position, and a door open unit for accurately detecting the position of the FOUP and the front door and automatically opening the front door. Thus, the carrying of the wafer between the neighboring pre-unit processes is easily automated to thereby complete an unmanned process flow line in the pre-process.

In contrast with the pre-process, the post-process does not necessarily require the same degree of the cleanliness as the pre-process, and the post-unit process apparatuses do not include a component or a unit corresponding to the door open unit. For those reasons, the substrate carrier for carrying a substrate, such as a PCB, between neighboring the post-unit processes does not include a sealing door corresponding to the front door of the FOUP.

Therefore, if the substrate carrier is automatically transferred between the neighboring post-unit processes, the substrate in the substrate carrier tends to be separated from the carrier in carrying the substrate. Thus, the substrate carrier in the post-process is usually manually transferred by a worker on the manufacturing line.

Thus, the overall process time for the post-process is increased by the transfer time for the manned transfer of the substrate carrier between the post-unit processes, and as a result, an overall efficiency of the post-process is significantly reduced by the manned transfer of the substrate carrier. In addition, the manned transfer of the substrate carrier limits the number of the substrates that are loaded in the substrate carrier because the carrier transfer is performed using manpower, not using mechanical power, which also reduces the overall efficiency of the post-process. Particularly, the substrate carrier in the post-process usually includes a relatively heavy substrate such as the PCB compared with a relatively light substrate such as a wafer in the pre-process, and thus, the manned transfer of the substrate carrier has much more serious effect on the overall efficiency of the post-process.

Accordingly, there has been a need for an improved transfer system for transferring the substrate carrier in the post-process without any damage to the substrate or unexpected unloading of the substrate from the carrier.

SUMMARY

At least one example embodiments of the inventive concepts provides an automatic carrier transfer for transferring the substrate carrier in the post-process without any damage to the substrate or unexpected unloading of the substrate from the carrier.

At least one example embodiment of the inventive concepts provides a method of automatically transferring the substrate carrier to a post-process apparatus using the above carrier transfer.

According to at least one example embodiment, a carrier transfer for automatically transferring a substrate carrier, comprises: a gripper detachably coupled to the substrate carrier, the substrate carrier including a plurality of substrates and at least one open gate through which the plurality of substrates are loaded into or unloaded from the substrate carrier; and a gate blocking unit secured to the gripper and configured to shift to a blocking position, the blocking position being a position of the gate blocking unit that partially blocks the gate to prevent the plurality of substrates from being separated from the substrate carrier during the automatic transferring of the substrate carrier.

According to at least one example embodiment, the gate blocking unit includes a moving plate secured to the gripper, and the moving plate changes position according to whether the gripper is coupled or decoupled with the substrate carrier, and a blocking member secured to the moving plate, and the blocking member extends downward along the substrate carrier.

According to at least one example embodiment, the blocking member is shifted from a stationary position to a blocking position by a rotation of the moving plate if the gripper is coupled to the substrate carrier, and the blocking member is shifted from the blocking position to the stationary position by the rotation of the moving plate if the gripper is decoupled from the substrate carrier, and the blocking member in the blocking position partially blocks the gate to prevent the plurality of substrates from being separated from the substrate carrier during the automatic transferring, and the blocking member in the stationary position allows the plurality of substrates to be loaded into or unloaded from the substrate carrier if the substrate carrier is stationary.

According to at least one example embodiment, the substrate carrier includes a wafer cassette configured to receive a plurality of wafers through a single gate, and the blocking member includes at least one bar having a length greater than a height of the wafer cassette.

According to at least one example embodiment, the blocking member shifts from a stationary position to the blocking position by a linear motion of the moving plate if the gripper is coupled to the substrate carrier, and the blocking member shifts from the blocking position to the stationary position by the linear motion of the moving plate if the gripper is decoupled from the substrate carrier, the stationary position being a position that allows the plurality of substrates to be loaded into or unloaded from the substrate carrier if the substrate carrier is stationary.

According to at least one example embodiment, the substrate carrier is configured to receive a plurality of flat substrates and includes two gates opposite to each other, and the blocking member includes two bars having a length greater than a height of the substrate carrier.

According to at least one example embodiment, each of the flat substrates in the plurality of flat substrates includes one of (i) a printed circuit board (PCB), on which a plurality of integrated circuit devices are mounted, and (ii) a glass substrate, on which a plurality of control circuit devices and driving circuit devices for a flat panel display (FDP) device are mounted.

According to at least one example embodiment, the substrate carrier includes a rectangular body having a holding space for holding the plurality of flat substrates, and the substrate carrier includes a coupling unit secured to an upper surface of the rectangular body, and the coupling unit includes a joint portion at an upper portion of the coupling unit, and the gripper includes a securing unit configured to be inserted into the joint portion so that the securing unit of the gripper is coupled to the joint portion of the coupling unit.

According to at least one example embodiment, the joint portion includes a first opening arranged in a direction of a width of the rectangular body, a second opening communicating with the first opening and arranged in a direction of a length of the rectangular body, and an insertion hole communicating with the second opening and through the coupling unit in the direction of the length of rectangular the body, and the securing unit includes a joint protrusion protruding downward from a lower portion of the gripper and into the first opening, and a joint connector extending from an inner sidewall of the joint protrusion in the direction of the length of the rectangular body and into the second opening so that the joint protrusion and the joint connector are moved together in the direction of the length of the rectangular body until the joint connector is inserted into the insertion hole such that the securing unit of the gripper is coupled to the joint portion of the coupling unit of the substrate carrier.

According to at least one example embodiment, the moving plate is secured to an outer sidewall opposite to the inner sidewall of the joint protrusion, and the blocking member is secured to an end portion of the moving plate and extends downward in a direction of a height of the rectangular body.

According to at least one example embodiment, the carrier transfer further comprises: a guide rail extending along a manufacturing line of a semiconductor manufacturing process over the substrate carrier; a transfer unit moving along the guide rail; and a connecting line extending downward from the transfer unit and connected to the gripper, a length of the connecting line being adjustable such that the gripper moves along a vertical direction according to a length of the connecting line.

According to at least one example embodiment, the carrier transfer further comprises: an aligner configured to align the gripper with the substrate carrier such that the gripper is coupled to the coupling unit at a desired coupling position.

According to at least one example embodiment, the aligner is integrally arranged in a body together with the gripper.

According to at least one example embodiment, a method of automatically transferring a substrate carrier in a post-process for manufacturing a semiconductor device, comprises: moving a transfer unit over the substrate carrier, the substrate carrier configured to receive a plurality of substrates through at least one gate; aligning a gripper with the underlying substrate carrier, the gripper being connected to the transfer unit by a connecting line; coupling the gripper to the substrate carrier after moving the gripper toward an upper portion of the substrate carrier; blocking the gate of the substrate carrier by positioning a gate blocking unit across the gate according to the coupling of the gripper to the substrate carrier; and moving the transfer unit along a guide rail, the transfer unit being coupled to the substrate carrier by the gripper.

According to at least one example embodiment, the blocking includes positioning the gate blocking unit across the gate by one of (i) rotating the gate blocking unit, and (ii) linearly shifting the gate blocking unit.

According to at least one example embodiment, a substrate transfer apparatus comprises: a substrate carrier having a first opening and configured to hold at least one substrate, the at least one substrate being a post-process substrate; and a gripper configured to detachably connect to the substrate carrier, the gripper including a first blocking member configured to control access to the at least one substrate through the opening.

According to at least one example embodiment, the first blocking member is configured to rotate between a stationary position and a blocking position to control access to the at least one substrate, the stationary position being a position that allows loading and unloading of the at least one substrate through the first opening, and the blocking position being a position that blocks unloading of at least one substrate through the first opening.

According to at least one example embodiment, the substrate carrier includes a second opening opposite to the first opening, and the gripper includes a second blocking member opposite to the first blocking member, and the first blocking member is positioned in front of the first opening, and the second blocking member is positioned in front of the second opening.

According to at least one example embodiment, the first blocking member and the second blocking member are configured to linearly shift between a stationary position and a blocking position to control access to the at least one substrate, the stationary position being a position that allows loading and unloading of the at least one substrate through at least one of the first and second openings, and the blocking position being a position that blocks unloading of the at least one substrate through at least one of the first and second openings.

According to at least one example embodiment, a transfer system, comprises: the substrate transfer apparatus; a guide rail connecting at least one pre-process chamber of a semiconductor manufacturing line to at least one post-process chamber, the at least one post-process chamber configured to perform at least one of an electronic die sort (EDS) test, a sawing process, a die attach process, a wire bonding process, a molding process, and a final test; and a transfer unit attached to the gripper and configured to move along the guide rail, the transfer unit being configured to automatically transfer the substrate carrier from the at least one pre-process chamber to the at least one post-process chamber along the guide rail during a semiconductor manufacturing process.

BRIEF DESCRIPTION OF THE DRAWINGS

Example embodiments will be more clearly understood from the following detailed description taken in conjunction with the accompanying drawings, in which.

DETAILED DESCRIPTION OF EXAMPLE EMBODIMENTS

Various example embodiments will be described more fully hereinafter with reference to the accompanying drawings, in which some example embodiments are shown. The inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1A:
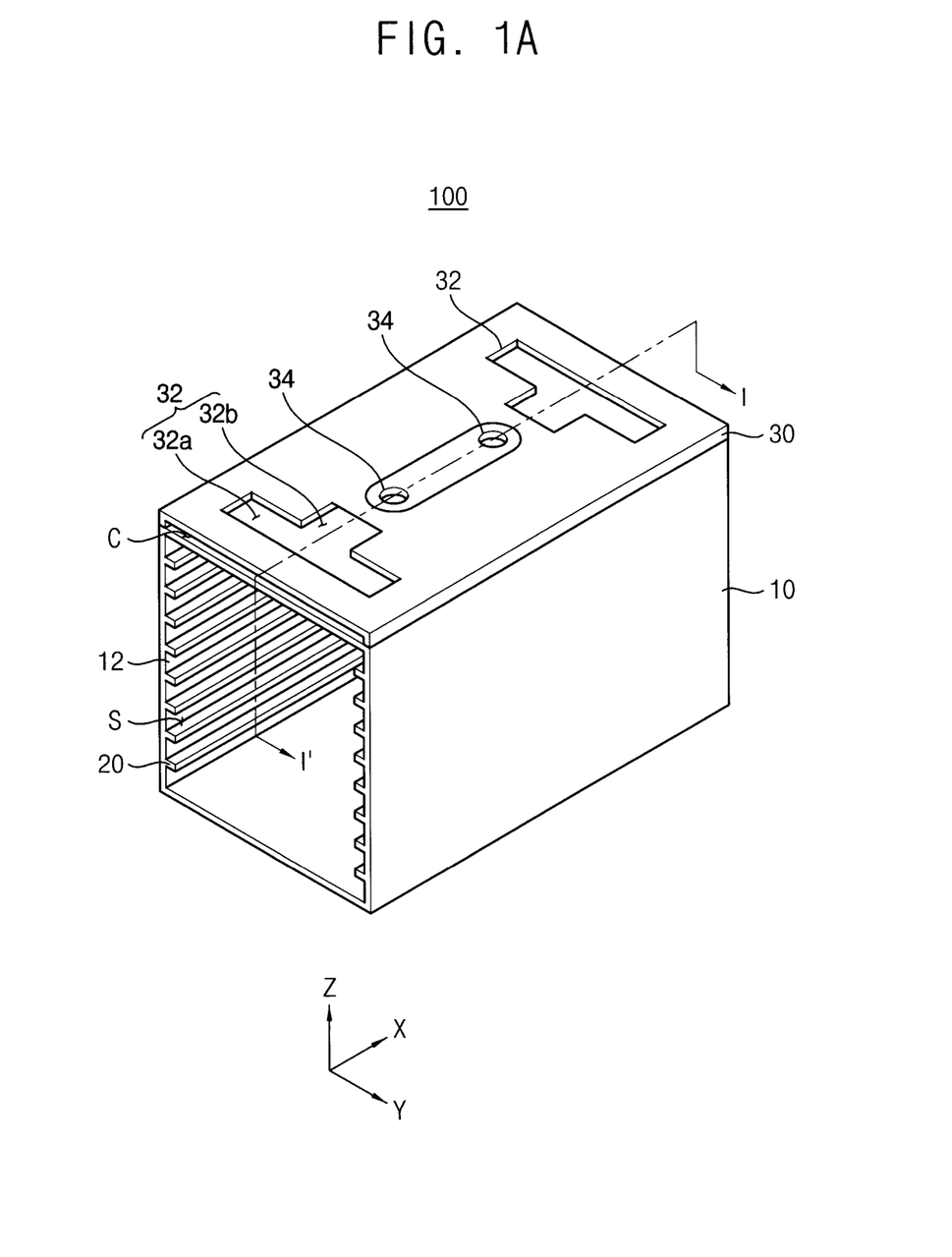
FIG. 1A is a perspective view illustrating substrate carrier in accordance with at least one example embodiment of the inventive concepts.
Figure 1B:
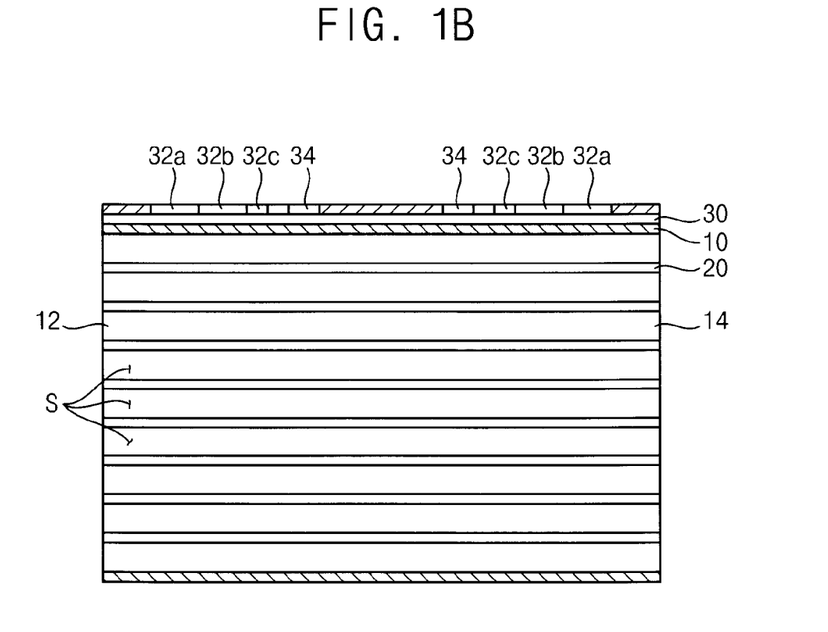
FIG. 1B is a cross-sectional view cut along a line I-I' of FIG. 1A.
Figure 1C:
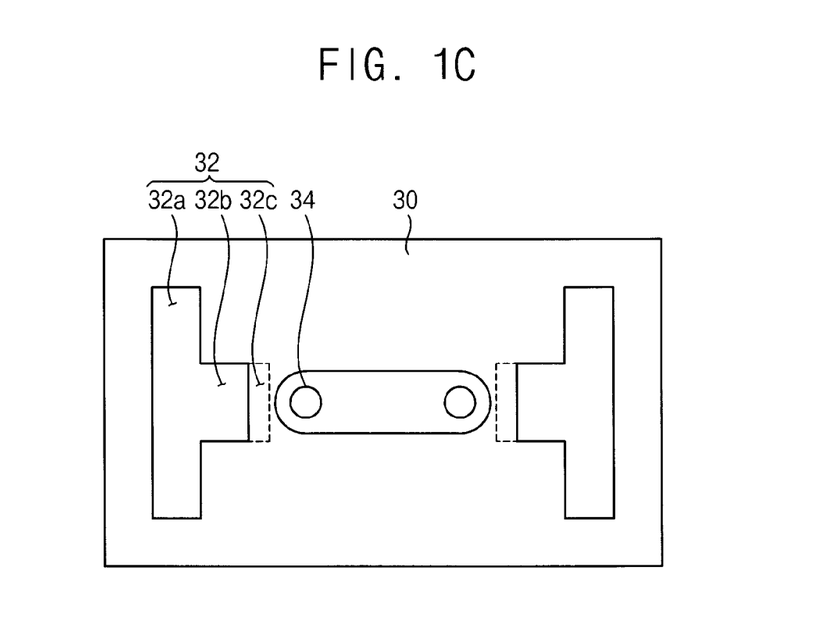
FIG. 1C is a plan view illustrating the substrate carrier shown in FIG. 1A.

FIG. 1A is a perspective view illustrating substrate carrier in accordance with at least one example embodiment of the inventive concepts. FIG. 1B is a cross-sectional view cut along a line I-I' of FIG. 1A and FIG. 1C is a plan view illustrating the substrate carrier shown in FIG. 1A. In FIGS. 1A to 1C, a PCB carrier for carrying the PCBs in a post-process is disclosed as an example embodiment of the substrate carrier. However, the substrate carrier of the inventive concepts may also include any other substrate carriers as well as the PCB carrier as long as the carrier is used for carrying substrates in the post-process.

Referring to FIGS. 1A to 1C, a substrate carrier 100 in accordance with at least one example embodiment of the inventive concepts may include a body 10 having a holding space S for holding substrates, a plurality of pairs of supports 20 positioned on sidewalls of the body 10 facing each other and supporting the substrates, and a coupling unit 30 positioned on an upper portion of the body 10 and having a joint portion 32 to which a carrier transfer may be coupled.

For example, the body 10 may have a three-dimensional shape and the holding space S may be provided inside of the body 10 with a desired (or alternatively, predetermined) volume. At least one open gate may be provided with the body 10 and thus the holding space S may be communicated with surroundings through the gate. The substrate may be loaded into or unloaded from the holding space S of the body 10 through the gate G. In at least one example embodiment, the body 10 may be shaped into a rectangle having a length corresponding to a length of the a printed circuit board (PCB) and may have a pair of first and second gates 12 and 14 at front and rear sides facing each other in a direction of the length. Thus, the PCB may be loaded into the holding space S through the first gate 12 in a first direction x along the length of the body 10 and may be unloaded from the holding space S through the second gate 14.

The support 20 may protrude from the sidewall of the body 10 toward the holding space S and an edge portion of the substrate may be positioned on an upper surface of the support 20. For example, the support 20 may provide a plurality of slits that may be arranged on each of the sidewalls facing each other in a third direction z along a height of the body 10 in such a configuration that a pair of the slits may be positioned at the same height on each facing sidewall of the body 10. Thus, the edge portion of each substrate may be supported by the facing support 20 and a plurality of the substrates may be stacked at each slit in the third direction z. The support 20 may include a continuous line extending in the first direction x. Alternatively, the support 20 may include a discontinuous line periodically extending in the first direction x.

The coupling unit 30 may be spaced apart from an upper surface of the body 10 and thus a gap space C may be provided between the body 10 and the coupling unit 30. The joint portion 32 may be provided at an upper surface of the coupling unit 30.

For example, the coupling unit 30 may include a flat plate that may be secured to an edge portion of the upper surface of the body 10 and the gap space C may communicate with surroundings through the joint portion 32. Therefore, the upper surface of the body 10 may be partially exposed through the joint portion 32.

The shape of the joint portion 32 may be varied according to a gripper of a carrier transfer for transferring the substrate carrier 100. In at least one example embodiment, the joint portion 32 may include a first opening 32a into which a joint protrusion of the carrier transfer may be inserted, a second opening 32b extending from the first opening 32a along the first direction x and guiding a joint connector of the carrier transfer, and an insertion hole 32c communicating with the second opening 32b and penetrating through the plate of the coupling unit 30. Therefore, the first and the second openings 32a and 32b may be open, and thus, the upper surface of the body 10 may be partially exposed through the first and the second openings 32a and 32b, while the insertion hole 32c may be covered with the flat plate of the coupling unit 30. Thus, the joint protrusion and the joint connector may be guided to the first and the second openings 32a and 32b of joint portion 32, and then the joint connector may be inserted into the insertion hole 32c as the joint protrusion moves along the first direction x. Therefore, the substrate carrier 100 may be coupled to the carrier transfer at the joint portion 32 of the coupling unit 30, which will be described in detail below.

In at least one example embodiment, a pair of the joint portions 32 may be arranged on the coupling unit 30 symmetrically with respect to an central axis of the body 10 along the first direction x, to thereby mitigate (or alternatively, prevent) tilting or rotation of the body 10 with respect to the second direction y when the substrate carrier 100 may be coupled to the carrier transfer.

The coupling unit 30 may further include an aligning member 34 for accurately aligning the joint protrusion of the carrier transfer with the joint portion 32. For example, the aligning member 34 may include a pair of aligning openings arranged on the upper surface of the coupling unit 30. Thus, when a pair of the joint protrusions that protrude from a lower surface of the carrier transfer are inserted into the aligning openings, the joint protrusion of the carrier transfer and the joint connector may be automatically guided into the first and the second openings 32a and 32b.

While FIG. 1C discloses the substrate carrier 100 and the carrier transfer may be aligned with each other by using the aligning openings, any other aligning means would be used as the aligning member in conjunction with or in place of the aligning openings. For example, an aligning mark may be formed on the upper surface of the coupling unit 30 and a sensor for detecting the aligning mark may be installed to the carrier transfer. In such a case, the sensor of the carrier transfer may detect the aligning mark at first, and then the joint protrusion of the carrier transfer may be aligned with the joint portion 32 of the coupling unit 30 based on the position of the aligning mark.

According to at least one example embodiment, the coupling unit 30 may be additionally provided on the body of the substrate carrier and coupling unit 30 may be coupled to the carrier transfer. The carrier transfer may automatically transfer the substrate carrier to the next post-unit process for manufacturing the semiconductor device without manned power, as described in detail below.

Figure 2:
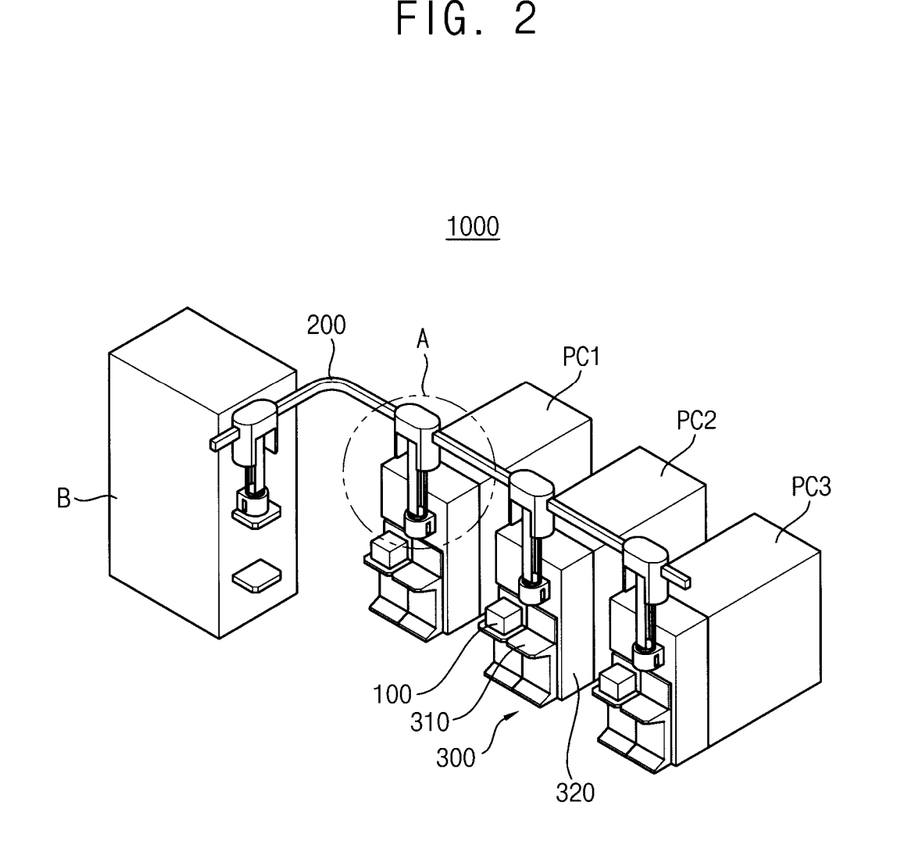
FIG. 2 is a structural view illustrating a carrier transfer system for automatically transferring the substrate carrier shown in FIG. 1A in accordance with at least one example embodiment of the inventive concepts.
Figure 3:
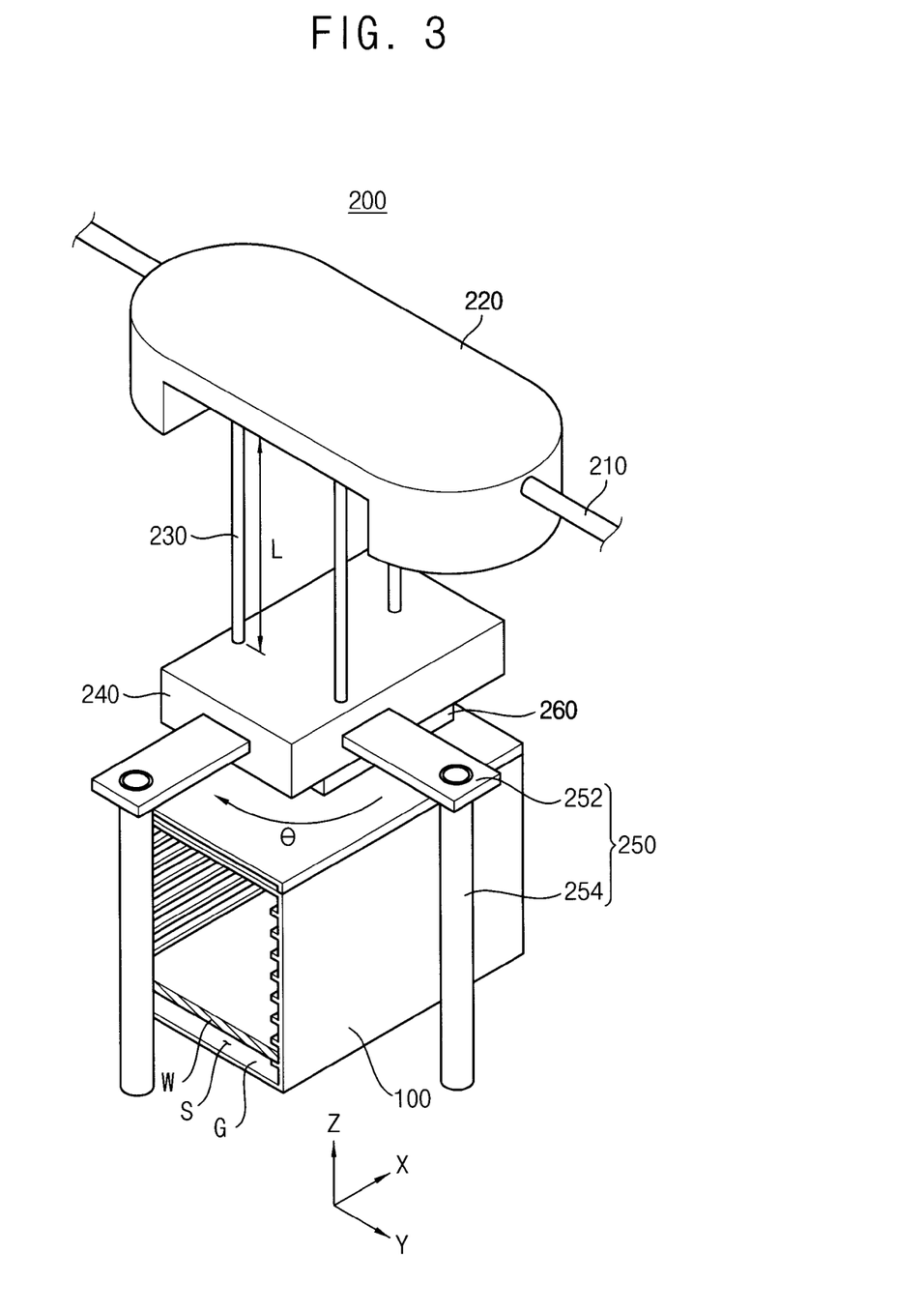
FIG. 3 is a perspective view illustrating a carrier transfer shown in FIG. 2 in accordance with at least one example embodiment of the inventive concepts.

FIG. 2 is a structural view illustrating a carrier transfer system for automatically transferring the substrate carrier shown in FIG. 1A in accordance with at least one example embodiment of the inventive concepts. FIG. 3 is a perspective view illustrating a carrier transfer shown in FIG. 2 in accordance with at least one example embodiment of the inventive concepts.

Referring to FIGS. 2 and 3, a carrier transfer system 1000 in accordance with at least one example embodiment of the inventive concepts may include a substrate buffer B in which a plurality of the substrates W may standby for the post-process, the substrate carrier 100 in which a group of the substrates are stacked from the substrate buffer B, a carrier transfer 200 for automatically transferring the substrate carrier 100 to a process apparatus according to a preset control protocol, and a substrate loading system 300 for loading the substrate into a process chamber PC of the process apparatus from the substrate carrier 100.

For example, the substrate buffer B may include a standby chamber in which a plurality of the substrates W may standby for the various post-processes, such as a package process. Thus, the shape and footprint of the chamber may be determined by an overall layout of the semiconductor device manufacturing line. Particularly, since the substrate carrier 100 may be automatically transferred mechanically by machine, an additional automatic loader (not illustrated) for loading the substrates into the substrate carrier 100 from the substrate buffer B may be installed to the substrate buffer B.

For example, the substrate carrier 100 may be located at a side of the substrate buffer B and a robot arm (not illustrated) may be positioned between the substrate carrier 100 and the substrate buffer B. Thus, a number of the substrates may be loaded into the substrate carrier 100 by the robot arm, and the number of the substrates may be carried to a next process apparatus at a time by the substrate carrier 100.

In at least one example embodiment, the substrate W may include a printed circuit board (PCB) to which a chip package process may be performed. The substrate may be a wafer including a plurality of integrated circuit devices fabricated by the pre-process and/or a wafer that has undergone some post-processes.

Although the semiconductor wafer and the PCB have been disclosed as the substrate, it should be understood that any other substrates may also be carried at a time by the above substrate carrier 100, as long as the substrate is under the post-process of the semiconductor manufacturing process, such as an EDS process, a cutting process, and/or a wire bonding process. For example, a glass substrate on which driving circuits for a flat panel display device may be printed may be carried by the substrate carrier 100, and the substrate carrier 100 including the glass substrates may be transferred to the next process apparatus by the above described carrier transfer system 1000.

The substrate carrier 100 may include the holding space S in which a plurality of the substrates may be stacked individually and separated from one another. Characteristics (e.g., a shape and volume) of the substrate carrier may be determined according to the substrates being carried between the neighboring unit process apparatus.

For example, when a semiconductor wafer may be carried between the neighboring post-unit process apparatuses, an open wafer cassette without a sealing door may be used for carrying the wafers between the unit process apparatuses. The wafer may be loaded into or unloaded from the holding space S of the wafer cassette through a single open gate of the wafer cassette. As described above, the post-process may not necessarily require the same degree of the cleanliness as the pre-process and conventional post-unit process apparatuses may not include a component or a unit corresponding to the door open unit of the FOUP. For those reasons, the wafer cassette for the post-process does not include the sealing door, and thus, the wafer cassette may be transferred without closing the gate. In such a case, when the wafer cassette may be transferred automatically by the automatic carrier transfer system 1000, the wafers in the open wafer cassette tend to be separated or dropped from the wafer cassette through the open gate.

In at least one example embodiment, when a large-sized substrate, such as the PCB and the glass substrate for a flat panel display (FPD) device, is carried between the neighboring post-unit process apparatuses, a magazine, which may be a kind of a PCB carrier in the post-process, may be used for carrying the substrates between the post-unit process apparatuses. According to at least one example embodiment, the magazine does not front door or a rear door, and thus, the magazine may be transferred without having to close a door.

Because the PCB or the glass substrate may have a larger size than the semiconductor wafer, the holding space S of the magazine holding a plurality of the PCBs or the glass substrates may be larger than that of the wafer cassette having a plurality of the wafers, and the magazine may be heavier than the wafer cassette holding a same number wafers. For those reasons, the magazine may have a separate inlet and a separate outlet, and the PCB or the glass substrate may be loaded into the magazine through the inlet and unloaded from the magazine through the outlet, respectively, so as to minimize the movement of the large-scaled magazine. In other words, the magazine may include an inlet gate for loading the PCB or the glass substrate and an outlet gate for unloading the PCB or the glass substrate, respectively.

In at least one example embodiment, the substrate carrier 100 for carrying the PCB or the glass substrate may have substantially the same structure as described in detail with reference to FIGS. 1A to 1C, except for a single open gate G. Thus, the detailed descriptions on the substrate carrier 100 for carrying the PCB and the glass substrate will be omitted hereinafter. In FIG. 2, the substrate carrier 100 may include a single open gate G and thus the substrates W may be loaded into or unloaded from the substrate carrier through only the open gate G.

The carrier transfer 200 may include a guide rail 210 installed over the process chamber PC of the process apparatus along the manufacturing line, a transfer unit 220 moving along the guide rail 210, a connecting line 230 extending downward from the transfer unit 220 and having an adjustable length L, a gripper 240 secured to the connecting line 230 and thus moving upwards and downwards according to the variation of the length of the connecting line 230, and a gate blocking unit 250 rotatably secured to the gripper 240 in such a configuration that the open gate of the substrate carrier 100 may be selectively blocked or opened. Thus, when the substrate carrier 100 receiving substrates may be automatically transferred, the gate of the substrate carrier 100 may be sufficiently blocked by the gate blocking unit 250, and thus, the substrates in the substrate carrier 100 are prevented from being separated or dropped from the carrier 100.

The guide rail 210 may extend along the manufacturing line and may have such a path that the substrate carrier 100 may be transferred to each process chamber PC in the manufacturing line. In addition, the guide rail 210 may be shaped into a bar having a rigidity and stress characteristics sufficient to endure an overall load of the transfer unit 220, the connecting line 230, the gripper 240, the gate blocking unit 250, and the weight of the substrate carrier 100 including the substrates. Thus, the guide rail 210 has the ability to withstand the overall load including the weight of all substrates in the substrate carrier 100.

The guide rail 210 may penetrate through the transfer unit 220, and the transfer unit 220 may be moved along the guide rail 210 by a control unit (not illustrated). For example, a roller (not illustrated) may be interposed between the guide rail 210 and the transfer unit 220 and the transfer unit 220 may move along the guide rail 210 by the rolling of the roller.

The connecting line 230 may include a cable and a flat belt extending downwards from a lower surface of the transfer unit 220 and the gripper 240 may be secured to an end portion of the connecting line 230. The length L of the connecting line 230 may be adjustable in the vertical direction, and thus the vertical position of the gripper 240 may be determined by the extending length L of the connecting line 230. Particularly, the length L of the connecting line 230 may be varied in accordance with the position of the substrate loading system 300 on which the substrate carrier 100 may be located. Thus, the substrate carrier 100 may be automatically transferred to a precise position of the substrate loading system 300 irrespective of the vertical position of the substrate loading system 300.

The gripper 240 may be mechanically or electrically secured to the substrate carrier 100. For example, in at least one example embodiment, a groove (not illustrated) may be arranged on the upper surface of the substrate carrier 100 and a protrusion (not illustrated) may be arranged on a lower surface of the gripper 240 and correspond to the groove. The protrusion of the gripper 240 may be coupled to the groove by an interference fit or to a stepped portion of the groove, and thus the substrate carrier 100 may be secured to the gripper 240 by a frictional force. In at least one other example embodiment, the gripper 240 and the substrate carrier 100 may be coupled to each other by an electrostatic force such as a Coulomb force. For example, a pair of electrodes having opposite polarities may be arranged on the gripper 240 and the substrate carrier 100, respectively, and the gripper 240 and the substrate carrier 100 may be electrically attracted to each other by the Coulomb force.

The gate blocking unit 250 may be rotatably secured to the gripper 240 in such a configuration that the gate blocking unit 250 may be rotated to be across the gate G in the third direction when the gripper 240 and the substrate carrier 100 are coupled to each other, and the gate blocking unit 250 may return to be across the sidewall of the body 10 when the gripper 240 are separated from the substrate carrier 100. Therefore, when the gripper 240 is coupled to the substrate carrier 100 and the carrier transfer 200 is ready for transferring the substrate carrier 100, the open gate G may be partially blocked by the gate blocking unit 250, and the substrates W in the substrate carrier 100 may be sufficiently blocked from being separated or dropped from the substrate carrier 100. In contrast, when the gripper 240 is separated from the substrate carrier 100 and the substrate carrier 100 is stationary, the gate blocking unit 250 may be removed from the open gate G and may return to an original position across the sidewall of the substrate carrier 100. Therefore, the gate G may be open and the substrates W may be freely loaded into or unloaded from the substrate carrier 100 through the open gate G. Accordingly, the gate blocking unit 250 may be rotated between a stationary position A across the sidewall of the carrier 100 and a blocking position B across the gate G along the third direction z.

Particularly, the gate blocking unit 250 may include a moving plate 252 rotatably secured to the gripper 240 and rotating according to the coupling and decoupling of the gripper 240 with the substrate carrier 100 and a blocking member 254 secured to the moving plate 252 and extending downwards in the third direction z to thereby be across the sidewall and the open gate G of the substrate carrier 100. Therefore, the blocking member 254 may be shifted from the stationary position A to the blocking position B by a rotation of the moving plate 252 when the gripper 240 is coupled to the substrate carrier 100 and may be shifted from the blocking position B to the stationary position A by the rotation of the moving plate 252 when the gripper 240 is decoupled from the substrate carrier 100. The blocking member 254 may partially block the open gate G at the blocking position B, so that the substrate W remains in the substrate carrier 100 during a transfer of the substrate carrier 100. The blocking member 254 may be far away from the gate G at the stationary position A so that the substrate W may be loaded into or unloaded from the substrate carrier 100 when the substrate carrier 100 is stationary.

In at least one example embodiment, when the gripper 240 is mechanically secured to the substrate carrier 100 by some linear or angular movements of the gripper 240, the moving plate 252 may be rotated at an amount of angle θ according to the linear or angular movements of the gripper 240. The blocking member 254 may be detachably secured to the moving plate 252 and may extend downward in the third direction z at the stationary position across the sidewall of the body 10. Then, the blocking member 254 may be rotated at the same amount of the angle θ as the moving plate 252 may rotate, and the blocking member 254 may be shifted to the blocking position across the first and the second gates G1 and G2 from the stationary position across the sidewall of the body 10.

When the substrate carrier 100 is stationary for loading or unloading the substrates W, the gate blocking unit 250 may be located at the stationary position A across the sidewall of the carrier 100. Then, when the substrate carrier 100 is ready for transferring after completing the loading or unloading of the substrates W, the gate blocking unit 250 may be located at the blocking position B by the rotation of the gripper 240. Thus, the substrates W in the substrate carrier 100 may be sufficiently prevented from being separated or dropped from the substrate carrier 100 through the open gate G by the gate blocking unit 250 when automatically transferring the substrate carrier 100 by the carrier transfer 200.

For example, the blocking member 254 may include a bar or a rod having a length greater than a height of the rectangular body of the substrate carrier 100. However, any other members having various shapes and structures as well as the bar and rod may also be used as the blocking member 254 as long as the members may be rotatably secured to the gripper 240 for blocking the gate G of the substrate carrier 100. For example, a blocking plate partially covering the gate G of the carrier 100 may be used for blocking the gate in place of the blocking bar or the blocking rod.

In at least one example embodiment, when the gripper 240 may be secured to the substrate carrier 100 by a Coulomb force caused by an electrical power, the electrical power may also control the moving plate 252 to rotate at the same angle θ.

In addition, an aligner 260 may be further provided under the gripper 240 and the gripper 240 may be aligned with a center of the substrate carrier by the aligner 260. Because the moving plate 252 is rotated with respect to a coupling point of the gripper 240 and the substrate carrier 100, the rotational contour of the moving plate 252 may be varied according to the coupling point of the gripper 240 and the substrate carrier 100. Therefore, when the gripper 240 and the substrate carrier 100 may be coupled at an inaccurate point, the blocking member 254 may be interrupted by the sidewall of the substrate carrier 100 when rotating between the stationary position A and the blocking position B according to the rotation of the moving plate 252. The aligner 260 may guide the gripper 240 to couple with the substrate carrier 100 at a desired coupling point, thereby mitigating (or alternatively, preventing) the rotation interruption of the blocking member 254 between the stationary position A and the blocking position B.

For example, the aligner 260 may include an aligning mark (not illustrated) on the upper surface of the substrate carrier 100 and a detection sensor on a lower surface of the gripper 240 for detecting the aligning mark.

When the gripper 240 and the substrate carrier 100 are aligned with each other by the aligner 260 in an allowable error range, the gripper 240 moves downward and couples to the substrate carrier 100.

The substrate loading system 300 may extract the substrates W from the substrate carrier 100 individually and may load the extracted substrates into the process chamber PC of the process apparatus.

For example, the substrate loading system 300 may include a load port 310 on which the substrate carrier 100 may be located by the carrier transfer 200 and an index 320 for individually extracting the substrate from the substrate carrier 100. The index 320 may include a load lock chamber (not illustrated) in which a robot arm may be positioned and load the substrate into the process chamber from the substrate carrier under a lower pressure. Then, the substrate may experience a specified process in the process chamber PC and the processed substrate may be removed from the process chamber by the robot arm through the load lock chamber. Finally, the processed substrate may be stacked again in the substrate carrier.

According to an example embodiment of the carrier transfer 200, when the substrate carrier 100 may be automatically transferred by the carrier transfer 200, the open gate G of the substrate carrier 100 may be sufficiently blocked by the blocking member 254 and the substrates W in the substrate carrier 100 may be sufficiently prevented from separating or dropping from the substrate carrier 100. Therefore, the process efficiency of the post-process may be remarkably improved due to the automatic carrier transfer.

Particularly, the magazine for carrying a PCB or a glass substrate for a FDP device that may have much larger size than a wafer may be automatically transferred between the neighboring process apparatuses without any manual operations and man powers. The conventional magazine has been manually transferred by the man power and thus just merely a few PCBs are transferred by the magazine at a time. However, the substrate carrier 200 of at least one example embodiment includes the coupling unit 30 at the upper portion of the body 10 as shown in FIG. 1A, and the substrate carrier 200 may be coupled to the carrier transfer 200 and may be automatically transferred by a mechanical power, not by manpower, to improve the transfer efficiency of the substrate carrier 100.

Various modifications of the carrier transfer 200 may be allowable according to the requirements and conditions of the manufacturing lines, as would be known to one of the ordinary skill in the art.

Figure 4:
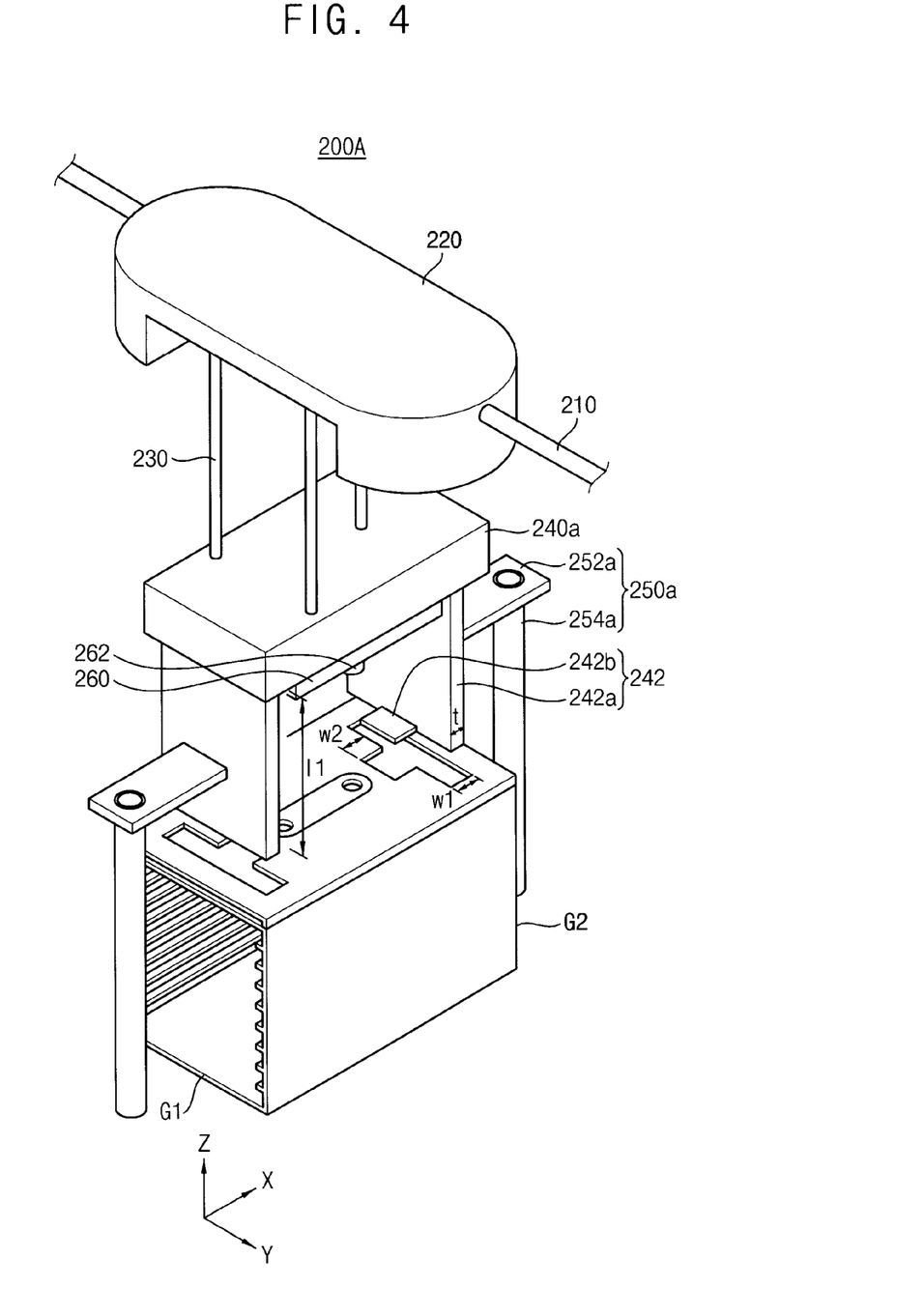
FIG. 4 is a perspective view illustrating a carrier transfer shown in FIG. 2 in accordance with at least one example embodiment of the inventive concepts.

FIG. 4 is a perspective view illustrating a carrier transfer shown in FIG. 2 in accordance with at least one example embodiment of the inventive concepts. The carrier transfer shown in FIG. 4 has substantially the same structures as the carrier transfer shown in FIG. 3, except that the substrate carrier may include a pair of open gates G1 and G2 and the gate blocking unit includes a configuration for a linear motion. Thus, in FIG. 4, the same reference numerals denote the same element and the same elements perform the same function in FIG. 3. Therefore, any detailed descriptions on the same elements in FIG. 3 will be omitted hereinafter. In addition, the substrate carrier 100 may have the same structure as described with reference to FIGS. 1A to 1C.

Referring to FIG. 4, a modified carrier transfer 200A in accordance with at least one example embodiment of the inventive concepts may include the guide rail 210 installed over the process chamber PC of the process apparatus along the manufacturing line, the transfer unit 220 moving along the guide rail 210, the connecting line 230 extending downward from the transfer unit 220 and having the adjustable length L, a gripper 240a secured to the connecting line 230 and thus moving upward and downward according to the variation of the length of the connecting line 230, and a gate blocking unit 250a secured to the gripper 240a and moving upward and downward according to the vertical movement of the gripper 240a in such a configuration that the open gates G1 and G2 of the substrate carrier 100 may be selectively blocked or opened. Thus, when the substrate carrier 100 receiving substrates W may be automatically transferred, the first and the second gates G1 and G2 of the substrate carrier 100 may be sufficiently blocked by the gate blocking unit 250a and the substrates W in the substrate carrier 100 may be prevented from being separated or dropped from the substrate carrier 100.

For example, the gripper 240a may include a securing unit 242 that may be secured to the coupling unit 30 of the substrate carrier 100. Particularly, the securing unit 242 may include a joint protrusion 242a that may be inserted into the first opening 32a and a joint connector 242b extending from the joint protrusion 242a along the length of the substrate carrier 100 and inserted into the second opening 32b. The joint connector 242b may be inserted into or separated from the insertion hole 32c according as the joint protrusion 242a may move linearly in the first direction x.

The joint protrusion 242a may be linearly moved in the gripper 240a by a mechanical or electrical driver along the direction of the length of the substrate carrier 100, that is, along the first direction x. Particularly, a pair of the joint protrusions 242a may be provided symmetrically with respect to the center of the substrate carrier 100, and the joint protrusions 242a may move close to each other or may recede back from each other within a variation range along the length of the substrate carrier 100. For example, the joint protrusion 242a may move forwards or recede backwards within a second width w2 of the second opening 32b. In such a case, the joint protrusion 242a may have a thickness t sufficiently smaller than a first width of the first opening 32a, and the joint protrusion 242a may move in the first direction x even after being inserted into the first opening 32a. The joint protrusion 242a may be shaped into a plate having a width along the second direction y and the joint connector 242b may be easily secured to the joint protrusion 242a.

In at least one example embodiment, the joint protrusion 242a may have such a configuration that the length l1 may be smaller than a gap distance between the body 10 and the coupling unit 30, and most of the joint protrusion 242a may be substantially received in the gap space C when the gripper 240a is coupled to the substrate carrier 100.

The joint connector 242b may protrude from an inner side surface of the joint protrusion 242a along the first direction x and may be inserted into the insertion hole 32c. In such a case, the joint connector 242b may make contact with the coupling unit 30 and the coupling unit 30 may be supported by the joint connector 242b at the insertion hole 32c.

In at least one example embodiment, the joint connector 242b and the joint protrusion 242a may be integrally arranged together with each other in one body. In case of gripping the substrate carrier 100 by using the carrier transfer 200A, the joint connector 242b may be inserted into the second opening 32b simultaneously when the joint protrusion 242a may be inserted into the first opening 32a. Then, the joint connector 242b may be inserted into the insertion hole 32c from the second opening 32b as the joint protrusion 242a moves along the first direction x. In contrast, in case of loosening the grip of the gripper 240a to the substrate carrier 100 by using the modified carrier transfer 200A, the pair of the joint protrusions 242a may recede backwards along the first direction x until the joint connectors 242b may fully recede to the second opening from the insertion hole 32c. Then, the joint protrusions 242a and the joint connectors 242b may simultaneously move upwards, and the securing unit 242 may be separated from the coupling unit 30 of the substrate carrier 100.

The gate blocking unit 250a may include a moving plate 252a secured to the joint protrusion 242a and linearly moving according to the motion of the joint protrusion 242a and a blocking member 254a secured to an end portion of the moving plate 252a and extending downward along the height of the substrate carrier 100, that is, in the third direction z of the substrate carrier 100. For example, the moving plate 252a may protrude from an outer side surface opposite to the inner side surface of the joint protrusion 242a and the blocking member 254a may extend downward from the end portion of the moving plate 252a.

Because a pair of the joint protrusions 242a may be arranged along the first direction x, a pair of the moving plates 252a may also be arranged along the first direction x symmetrical with each other to the center of the substrate carrier 100. Particularly, the moving plate 252a may extend out of an edge portion of the coupling unit 30 when the joint connector 242b may be inserted into the insertion hole 32c. That is, the moving plate 252a may have a length longer than a distance between the joint protrusion 242a and an edge line of the coupling unit 30 of the substrate carrier 100.

In at least one example embodiment, the blocking member 254a may be secured to the end portion of the moving plate 252a and may extend downward along the third direction z and may be positioned across the gates G1 and G2 of the substrate carrier 100. Thus, the substrates W in the substrate carrier 100 may be prevented from being separated or dropped from the substrate carrier 100 when the substrate carrier 100 is automatically transferred by the carrier transfer 200. The blocking member 254a may be shifted from the stationary position to the blocking position by a linear motion of the moving plate 252a when the gripper 240a is coupled to the substrate carrier 100 and may be shifted from the blocking position to the stationary position by the linear motion of the moving plate 252a when the gripper 240a is decoupled from the substrate carrier 100. The blocking member 254a may partially block the first and the second gates G1 and G2 at the blocking position so that the substrate W is prevented from being separated from the substrate carrier 100 when the substrate carrier 100 is automatically transferred and the blocking member 250a may be far away from the first and the second gates G1 and G2 at the stationary position so that the substrate W may be loaded into or unloaded from the substrate carrier 100 when the substrate carrier 100 is stationary.

For example, the blocking member 254a may be shaped into a bar or a rod that may be across the gate and have a length greater than the height of the substrate carrier 100. The shape of the blocking member 254a may be varied according to the shape and usage of the substrate carrier 100, as would be known to one of the ordinary skill in the art.

Particularly, the aligner 260 of the medicated carrier transfer 200A may further include an aligning protrusion 262 corresponding to the aligning member 34 of the coupling unit 30. In at least one example embodiment, an aligning opening may be provided as the aligning member 34 and thus the gripper 240a may be accurately aligned with the substrate carrier 100 by the insertion of the aligning protrusion 262 into the aligning opening. Accordingly, the securing unit 242 may be accurately coupled to the joint portion 32 of the coupling unit 30 without any manual operation.

Hereinafter, the coupling of the modified carrier transfer with the substrate carrier will be described in detail with reference to FIGS. 5A and 5B.

Figure 5A:
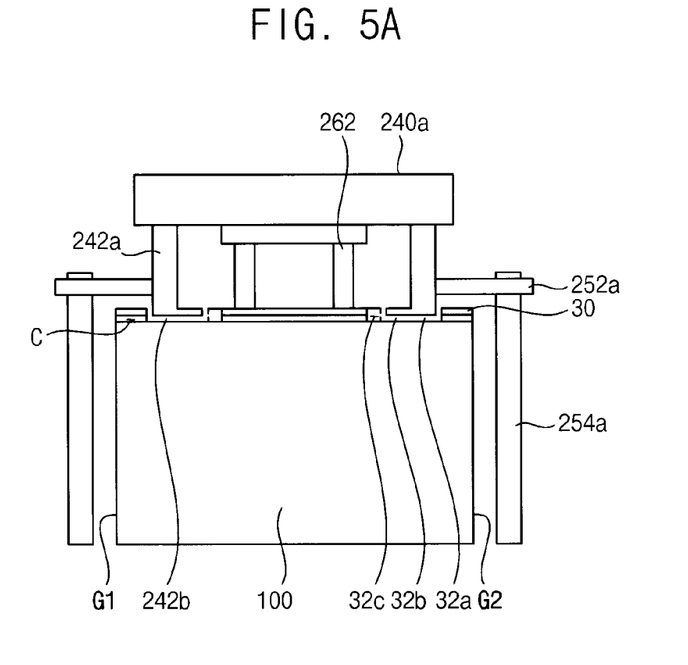
FIGS. 5A and 5B are views illustrating the coupling of the substrate carrier and the carrier transfer shown in FIG. 4.
Figure 5B:
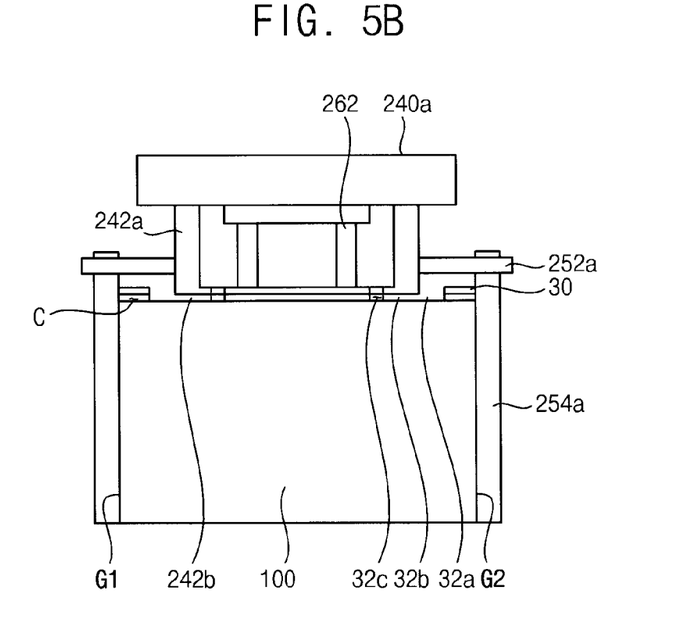

FIGS. 5A and 5B are view illustrating the coupling of the substrate carrier and the carrier transfer shown in FIG. 4.

Referring to FIGS. 5A and 5B, the gripper 240a may be aligned with the coupling unit 30 of the substrate carrier 100 by the aligner 260, and then the gripper 240a may move downward in such a way that the joint protrusion 242a and the joint connector 242b of the securing unit 242 may be inserted into the first opening 32a and the second opening 32b of the joint portion 32, respectively. At that time, the blocking member 254a of the gate blocking unit 250a may be spaced apart from the gates G1 and G2. Thereafter, the joint protrusion 242a and the joint connector 242b may move along the first direction x in such a way that the joint connector 242b may be inserted into the insertion hole 32c. The blocking member 254a may also move toward the substrate carrier 100 around the gate G1 and G2 according as the joint protrusion 242a may move toward the center of the substrate carrier 100, and thus the blocking member 254a may make contact with the body 10 of the substrate carrier 100 at the first and the second gates G1 and G2. Since the insertion hole 32c may be covered with the coupling unit 30, the joint connector 242b may make contact with the coupling unit 30. As a result, when the connecting line 230 may move upwards and the length L of the connecting line 230 may be decreased, the substrate carrier 100 may be lifted since the coupling unit 30 may be supported by the joint connector 242b. Then, the substrate carrier 100 may be transferred according as the transfer unit 220 may be moved along the guide rail 210. In such a case, since the first and the second gates G1 and G2 may be sufficiently blocked by the blocking member 254a, the substrates W in the carrier 100 may be prevented from being separated or dropped from the carrier 100 when automatically transferring substrate carrier 100.

When the substrate carrier 100 may be positioned on the substrate loading system 300 that may be arranged in front of the process chamber PC by the carrier transfer 200, the joint connector 242b may recede backwards to the second opening 32b according as the joint protrusion 242a may recede backwards. In addition, the blocking member 254a may be again spaced apart from the body 10 of the carrier 100 at the first and the second gates G21 and G2 according as the joint protrusion 242a may recede backwards. Then, when the connecting line 230 may move upward and thus the length L of the connecting line 230 may be decreased, the gripper 240a may also move upward and may be separated from the joint portion 32 of the coupling unit 30. The blocking member 254a may also be lifted upward according as the joint protrusion 242a may move upwards and thus may be removed from the gates G1 and G2. As a result, the first and the second gates G1 and G2 may be open and the substrates W in the carrier 100 may be ready for the extraction into the process chamber PC.

While at least one example embodiment discloses the carrier transfer 200 and the substrate carrier 100 may be used for an overhead hoist transport (OHT) system having the guide rail over the manufacturing line of the semiconductor devices as the carrier transfer system 1000, it should be understood other automatic carrier transfer systems may also utilize the carrier transfer 200 and the substrate carrier 100. For example, when the substrate carrier may be continuously transferred by a conveyor system or may be individually transferred by a transport vehicle and a transport robot in place of the transfer unit moving along the guide rail, the gates of the substrate carrier may also be blocked by the blocking member and the substrates in the carrier may also be prevented from being separated or dropped from the carrier during the carrier transfer.

Figure 6:
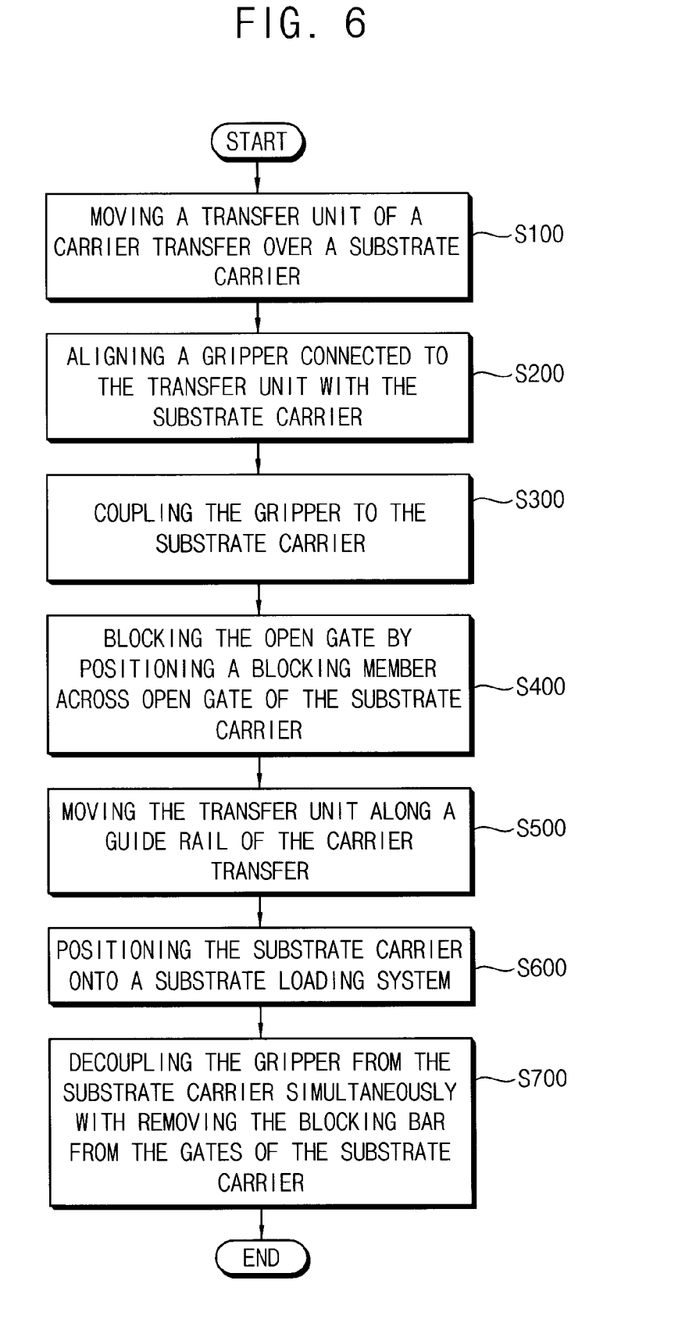
FIG. 6 is a flow chart showing processing steps for a method of automatically transferring the substrate carrier by the carrier transfer in accordance with at least one example embodiment of the inventive concepts.

FIG. 6 is a flow chart showing processing steps for a method of automatically transferring the substrate carrier by the carrier transfer in accordance with at least one example embodiment of the inventive concepts. In FIG. 6, the substrate carrier may be automatically transferred by one of the carrier transfers shown in FIGS. 3 and 4.

Referring to FIG. 6, according to a transfer signal from a transfer controller of the automatic carrier transfer system, the transfer unit 220 may be moved over the substrate carrier 100 that is to be transferred (step S100). The transfer controller may select the substrate carrier 100 in such a way that the transfer path and the transfer time may be reduced (or alternatively, minimized) in view of an overall manufacturing line of the semiconductor post-process.

Then, the connecting line 230 may be adjusted in such a way that the gripper 240 may approach the substrate carrier 100. The gripper 240 may be aligned with the substrate carrier 100 by the aligner 260 (step S200). The alignment between the gripper 240 and the substrate carrier 100 may be performed by a mechanical process in which a pair of counterparts may be mechanically coupled or by an electrical process in which an electrical signal of the aligning mark may be detected by a sensor.

After aligning the gripper 240 with the substrate carrier 100, the gripper 240 moves downward close to the upper portion of the substrate carrier 100 and the blocking member 254 of the gate blocking unit 250 may be positioned around the open gate G of the substrate carrier 100. For example, the blocking member 254 may be positioned close to the sidewall of the substrate carrier 100 or may be positioned far away from the open gate G.

Then, the gripper 240 may be coupled to the substrate carrier 100 (step 300) and the open gate G of the substrate carrier 100 may be blocked by the blocking member 254 simultaneously with the coupling of the gripper 240 to the substrate carrier 100 (step S400).

For example, the moving plate 252 may be rotated according as the gripper 240 may be secured to the coupling unit 30 of the substrate carrier 100 and thus the blocking member 254 secured to the moving plate 252 may be rotated to the blocking position. The blocking member 254 may make contact with the body 10 of the substrate carrier 100 at the blocking position and may extend across the open gate G in a direction of the height thereof, that is, along the third direction z, and thus the open gate G of the substrate carrier 100 may be partially blocked along the third direction z. Otherwise, the moving plate 252a of the gate blocking unit 250a may move toward the center of the substrate carrier 100 simultaneously when the securing unit 242 of the gripper 240a may be coupled to the joint portion 32 of the substrate carrier 100, and thus the blocking member 254a secured to the moving plate 252a may also be moved to the blocking position. Accordingly, the open gate of the substrate carrier 100 may be partially blocked by the block bar and the substrates in the carrier 100 may be prevented from being separated or dropped from the carrier when automatically being transferred.

After the coupling the gripper 240 to the substrate carrier 100, the connecting line 230 may be adjusted in such a way that the substrate carrier 100 may be lifted and the transfer unit 220 may move along the guide rail 210 to a specific process apparatus (step S500). In such a case, the substrate W in the substrate carrier 100 may be sufficiently separated or dropped from the carrier 100 by the blocking member 254.

Thereafter, the substrate carrier 100 may be positioned onto the substrate loading system 300 of the process chamber PC the specific process apparatus (step S600) and the gripper 240 may be separated from the substrate carrier 100 by the transfer controller (step S700). The blocking member may be removed from the open gate of the substrate carrier 100 simultaneously when the gripper 240 may be separated from the substrate carrier 100. Thereafter, the substrates W in the substrate carrier 100 may be extracted by an extracting unit such as the robot arm and may be loaded to the process chamber PC.

According to the at least one example embodiment, the open gate of the substrate carrier may be partially blocked by the blocking member simultaneously when the carrier transfer may be coupled to the substrate carrier, and thus the substrate carrier may be automatically transferred to the process chamber without any substrate separation or drop from the substrate carrier through the open gate.

Therefore, the substrate carrier may be automatically transferred with high reliability, thereby reducing transfer time and cost in transferring the substrate carrier in the semiconductor post-process.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A carrier transfer for automatically transferring a substrate carrier, comprising:
    a gripper detachably coupled to the substrate carrier, the substrate carrier including a plurality of substrates and at least one open gate through which the plurality of substrates are loaded into or unloaded from the substrate carrier; and
    a gate blocking unit secured to the gripper and configured to shift to a blocking position, the blocking position being a position of the gate blocking unit that partially blocks the gate to prevent the plurality of substrates from being separated from the substrate carrier during the automatic transferring of the substrate carrier.

2. The carrier transfer of claim 1, wherein the gate blocking unit includes
a moving plate secured to the gripper, the moving plate being configured to change position according to whether the gripper is coupled or decoupled with the substrate carrier, and
a blocking member secured to the moving plate, the blocking member extending downward along the substrate carrier.

3. The carrier transfer of claim 2, wherein
the blocking member is configured to be shifted from a stationary position to a blocking position by a rotation of the moving plate if the gripper is coupled to the substrate carrier, and
the blocking member is configured to be shifted from the blocking position to the stationary position by the rotation of the moving plate if the gripper is decoupled from the substrate carrier, and
the blocking member in the blocking position partially blocks the gate to prevent the plurality of substrates from being separated from the substrate carrier during the automatic transferring, and the blocking member in the stationary position allows the plurality of substrates to be loaded into or unloaded from the substrate carrier if the substrate carrier is stationary.

4. The carrier transfer of claim 3, wherein
the substrate carrier includes a wafer cassette configured to receive a plurality of wafers through a single gate, and
the blocking member includes at least one bar having a length greater than a height of the wafer cassette.

5. The carrier transfer of claim 2, wherein
the blocking member is configured to shift from a stationary position to the blocking position by a linear motion of the moving plate if the gripper is coupled to the substrate carrier, and
the blocking member is configured to shift from the blocking position to the stationary position by the linear motion of the moving plate if the gripper is decoupled from the substrate carrier, the stationary position being a position that allows the plurality of substrates to be loaded into or unloaded from the substrate carrier if the substrate carrier is stationary.

6. The carrier transfer of claim 5, wherein
the substrate carrier is configured to receive a plurality of flat substrates and includes two gates opposite to each other, and
the blocking member includes two bars having a length greater than a height of the substrate carrier.

7. The carrier transfer of claim 6, wherein each of the flat substrates in the plurality of flat substrates includes one of (i) a printed circuit board (PCB), on which a plurality of integrated circuit devices are mounted, and (ii) a glass substrate, on which a plurality of control circuit devices and driving circuit devices for a flat panel display (FDP) device are mounted.

8. The carrier transfer of claim 6, wherein
the substrate carrier includes a rectangular body having a holding space for holding the plurality of flat substrates, and
the substrate carrier includes a coupling unit secured to an upper surface of the rectangular body, and the coupling unit includes a joint portion at an upper portion of the coupling unit, and
the gripper includes a securing unit configured to be inserted into the joint portion so that the securing unit of the gripper is coupled to the joint portion of the coupling unit.

9. The carrier transfer of claim 8, wherein
the joint portion includes a first opening arranged in a direction of a width of the rectangular body, a second opening communicating with the first opening and arranged in a direction of a length of the rectangular body, and an insertion hole communicating with the second opening and through the coupling unit in the direction of the length of rectangular the body, and
the securing unit includes a joint protrusion protruding downward from a lower portion of the gripper and into the first opening, and a joint connector extending from an inner sidewall of the joint protrusion in the direction of the length of the rectangular body and into the second opening so that the joint protrusion and the joint connector are moved together in the direction of the length of the rectangular body until the joint connector is inserted into the insertion hole such that the securing unit of the gripper is coupled to the joint portion of the coupling unit of the substrate carrier.

10. The carrier transfer of claim 9, wherein
the moving plate is secured to an outer sidewall opposite to the inner sidewall of the joint protrusion, and
the blocking member is secured to an end portion of the moving plate and extends downward in a direction of a height of the rectangular body.

11. The carrier transfer of claim 1, further comprising:
a guide rail extending along a manufacturing line of a semiconductor manufacturing process over the substrate carrier;
a transfer unit moving along the guide rail; and
a connecting line extending downward from the transfer unit and connected to the gripper, a length of the connecting line being adjustable such that the gripper moves along a vertical direction according to a length of the connecting line.

12. The carrier transfer of claim 11, further comprising:
an aligner configured to align the gripper with the substrate carrier such that the gripper is coupled to the coupling unit at a desired coupling position.

13. The carrier transfer of claim 12, wherein the aligner is integrally arranged in a body together with the gripper.

14. A substrate transfer apparatus, comprising:
a substrate carrier having a first opening and configured to hold at least one substrate; and
a gripper configured to detachably connect to the substrate carrier, the gripper including a first blocking member secured to one side of the gripper and configured to control access to the at least one substrate through the first opening, the first blocking member having a length greater than a height of the first opening and extending downward along the substrate carrier.

15. The apparatus of claim 14, wherein the first blocking member is configured to rotate between a stationary position and a blocking position to control access to the at least one substrate, the stationary position being a position that allows loading and unloading of the at least one substrate through the first opening, and the blocking position being a position that blocks loading and unloading of at least one substrate through the first opening.

16. The apparatus of claim 14, wherein
the substrate carrier includes a second opening opposite to the first opening, and the gripper includes a second blocking member secured to the gripper on an opposite side of the first blocking member.

17. The apparatus of claim 16, wherein the first blocking member and the second blocking member are configured to linearly shift between a stationary position and a blocking position to control access to the at least one substrate, the stationary position being a position that allows loading and unloading of the at least one substrate through at least one of the first and second openings, and the blocking position being a position that blocks loading and unloading of the at least one substrate through at least one of the first and second openings.

18. A transfer system, comprising:
   the substrate transfer apparatus of claim 14;
   a guide rail connecting at least one pre-process chamber of a semiconductor manufacturing line to at least one post-process chamber, the at least one post-process chamber configured to perform at least one of an electronic die sort (EDS) test, a sawing process, a die attach process, a wire bonding process, a molding process, and a final test; and
   a transfer unit attached to the gripper and configured to move along the guide rail, the transfer unit being configured to automatically transfer the substrate carrier from the at least one pre-process chamber to the at least one post-process chamber along the guide rail during a semiconductor manufacturing process.

* * * * *